US009869857B2

(12) United States Patent
Zhu et al.

(10) Patent No.: US 9,869,857 B2
(45) Date of Patent: Jan. 16, 2018

(54) OPTICAL GRATING PHASE MODULATOR FOR LASER INTERFERENCE PHOTOETCHING SYSTEM (71) Applicant: Tsinghua University, Beijing (CN)

(72) Inventors: Yu Zhu, Beijing (CN); Ming Zhang, Beijing (CN); Leijie Wang, Beijing (CN); Rong Cheng, Beijing (CN); Kaiming Yang, Beijing (CN); Zhao Liu, Beijing (CN); Jinchun Hu, Beijing (CN); Wensheng Yin, Beijing (CN); Haihua Mu, Beijing (CN); Chuxiong Hu, Beijing (CN); Dengfeng Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/761,605

(22) PCT Filed: Jan. 13, 2014

(86) PCT No.: PCT/CN2014/070521
§ 371 (c)(1),
(2) Date: Jul. 16, 2015

(87) PCT Pub. No.: WO2014/111000
PCT Pub. Date: Jul. 24, 2014

(65) Prior Publication Data
US 2015/0362723 A1 Dec. 17, 2015

(30) Foreign Application Priority Data
Jan. 17, 2013 (CN) .......................... 2013 1 0017800

(51) Int. Cl.
*G02B 26/00* (2006.01)
*G02B 5/18* (2006.01)
(Continued)

(52) U.S. Cl.
CPC ............... *G02B 26/06* (2013.01); *G03F 7/20* (2013.01); *G03F 7/70316* (2013.01); *G03F 7/70408* (2013.01)

(58) Field of Classification Search
USPC ................ 359/290, 291, 292, 295, 298, 237
See application file for complete search history.

(56) References Cited

U.S. PATENT DOCUMENTS 4,820,055 A * 4/1989 Muller .................. G03F 9/7023
356/401

FOREIGN PATENT DOCUMENTS

| CN | 1371001 A | 9/2002 |
|----|-----------|--------|
| CN | 1456862 A | 11/2003 |

(Continued)

OTHER PUBLICATIONS

Jie, W.Y. et al. "Multi-Channel FIR HCN Laser Interferometer on HT-7 TOKAMAK", Institute of Plasma Physics, Hefei Anhui, People's Republic of China, International Journal of Infrared and Millimeter Wave, vol. 21, No. 9, Jun. 2000, 6 pages.

(Continued)

*Primary Examiner* — Brandi Thomas
(74) *Attorney, Agent, or Firm* — Holzer Patel Drennan (57) ABSTRACT An optical grating phase modulator for a laser interference photoetching system is composed of a substrate, an optical grating, an electric motor and an optical grating positioner. The optical grating, the electric motor and the optical grating positioner are all mounted on the substrate. The optical grating is circular or rectangular, and adopt transmission or reflection type optical grating. A light beam is incident on the optical grating and generates diffraction, and when the electric motor drives the optical grating to continuously move relative to the incident light beam, diffracted light will generate a frequency shift, thereby realizing the phase (Continued)

modulation of the light beam. The optical grating phase modulator has the advantages of high phase modulation speed, high regulation precision and wide regulation range, thereby improving the whole performance of an interference photoetching system.

4 Claims, 6 Drawing Sheets

(51) Int. Cl.
*G02B 26/06* (2006.01)
*G03F 7/20* (2006.01)

(56) References Cited

FOREIGN PATENT DOCUMENTS

| CN | 101710191 A | 5/2010 | |
|---|---|---|---|
| CN | 103064262 A | 4/2013 | |
| CN | 103092002 A | 5/2013 | |
| CN | 103092003 A | 5/2013 | |
| JP | 2004287029 A | 10/2004 | |
| JP | 2004-287029 | * 10/2014 | ............. G02B 26/06 |

OTHER PUBLICATIONS

Yusheng, Sun et al. "A frequency-adzustable optical frequency shifter" Shanghai Institute of Laser Technology, Laser Journal, vol. 3, No. 5, 1987, 3 pages.

* cited by examiner

OPTICAL GRATING PHASE MODULATOR FOR LASER INTERFERENCE PHOTOETCHING SYSTEM

CROSS-REFERENCE TO RELATED APPLICATIONS

This application is a National Stage of International Patent Application No. PCT/CN2014/070521, entitled "OPTICAL GRATING PHASE MODULATOR FOR LASER INTERFERENCE PHOTOETCHING SYSTEM" and filed on 13 Jan. 2014, which takes priority from Chinese Patent Application 201310017800.X filed on 17 Jan. 2013, all of which are incorporated herein by reference in their entirety.

TECHNICAL FIELD

The present invention relates to an optical grating phase modulator, particularly, to an optical grating phase modulator for phase modulation in a laser interference photoetching system.

BACKGROUND ART

Laser interference photoetching is an important method of manufacturing micro or nano-scale array device by exposing a photosensitive substrate using periodical diagram generated by interference between two or more laser beams. This photoetching technology is mainly applied in manufacturing devices which has a feature size lower than subwavelength such as hole array/matrix, spot array/matrix, pillar array/matrix, grating and micro-lens array etc., which have a wide application in national defense, civil engineering and scientific research etc.

Recently, some important engineering systems such as large astronomical telescope, laser ignition system for inertial confinement nuclear fusion and photoetching system etc., have an increasing demanded for size, grid density and precision, and grating manufacturing is developing towards meter-scaled size, nano-scaled precision and grid density of sub-$10^4$, and manufacturing gratings which have large size, high precision and high grid density has becoming a problem of main concern which needs to be solved. Conventional manufacturing technique mainly includes mechanical scratching, laser direct writing, and mechanical splicing, etc. The mechanical scratching has the disadvantages of poor precision in large-size processing, long periodical of processing, and ghost line present in processed gratings etc. The laser direct writing has the disadvantages of poor precision in large-size processing and long periodical of processing etc. The mechanical splicing has the disadvantages of poor precision of splicing, complicated splicing process and high cost etc. Thus it is difficult to use these techniques to achieve the above mentioned quality. In contrast, laser interference photoetching or holographic photoetching has advantages of high grid density and high precision in large-size process and short processing cycle etc. in manufacturing grating of the above-mentioned high quality, therefore, laser interference photoetching is gradually becoming the mainstream technology in manufacturing grating of large-size and high precision. The development of laser interference photoetching system is a major difficulty in laser interference photoetching applicable in manufacturing grating of large-size and high precision, and the development of laser interference photoetching system of high precision is really high technology. With respect to the development of laser interference photoetching system of high precision, major large companies or corporations and research institutes in the art have exerted lots of efforts. Image locking of high speed and high precision is a key technology which directly determines the precision of image locking. Many scientific institutes have made developments in this field, some of which have been disclosed in patents.

One patent of MIT, i.e., U.S. Pat. No. 5,142,385 discloses a laser interference photoetching system which comprises a image locking device which performs image locking through phase modulation of beams with an electro-optic phase modulator, but the electro-optic phase modulator has the disadvantages of low speed of phase modulation, low precision of modulation and narrow range of modulation, which is difficult to meet the requirements for image locking of high precision.

Another patent of MIT, i.e., U.S. Pat. No. 6,882,477B1 discloses a scanning laser interference photoetching system, which comprises an acoustic-optic image locking device which performs image locking through phase modulation of beams with an acoustic-optic modulator. Although the acoustic-optic modulator has advantages of high speed of modulation, high precision of modulation and infinite range of modulation etc., however, the acoustic-optic modulator performs phase modulation through frequency modulation, which changes the frequency and coherence characteristics. And during the frequency modulation, the direction of beam emitted from the acoustic-optic modulator also changes which may influence the precision of image locking, the contrast ratio of image, and depth of focus, and size of focal spot etc. of the system. Besides, the phase modulation by the acoustic-optic modulator may increase the complicatedness of optical path of the system. Taking the above issues into consideration, the phase modulation by the acoustic-optic modulator may not be an optimal choice. Meanwhile, this patent also discloses an image locking device which performs image locking through phase modulation with an optical reflector seat driven by piezoelectric ceramics. This image locking device performs phase modulation of beams by changing the position of the reflector with the optical reflector seat driven by piezoelectric ceramics. This method does not change the frequency of beams and does not influence the coherence characteristics of the exposing rays, but the change of the position of the reflector may influence the contrast ratio of image, and depth of focus and size of focal spot etc. of the system, and the driving of the optical reflector seat by piezoelectric ceramics has the disadvantages of low speed of modulation, low precision of modulation, and limited range of modulation, which is also difficult to meet the requirements of image locking of high speed and high precision.

In view of the above problems, the present invention aims to provide an optical grating phase modulator used for phase modulation in a laser interference photoetching system, in which the phase modulator is achieved by Doppler shift effect of a moving grating, and such a phase modulator has the advantages of high speed of phase modulation, high precision of modulation and wide range of modulation etc. With a proper arrangement of laser interference photoetching system, the phase modulation of the grating phase modulator does not influence the precision of the system, the contrast ratio of image, and depth of focus and size of focal spot etc. of the system, and besides, the optical path of the system is simple, all of which make contributions to the improvement of the overall performance of the laser interference photoetching system.

SUMMARY OF THE INVENTION

One object of the present invention is to provide an optical grating phase modulator for phase modulation of a laser interference photoetching system, which has the advantages of high speed of phase modulation, high precision of phase modulation, and wide range of modulation. The phase modulation by the grating phase modulator does not influence the precision of system, the contrast ratio, and depth of focus and size of focal spot etc. of the system, and the optical path of the system is simple and clear, thereby improving the overall performance of the laser interference photoetching system.

The solutions of the present invention are as follows.

An optical grating phase modulator for a laser interference photoetching system, wherein: the grating phase modulator is a circular grating phase modulator, and the circular grating phase modulator includes: a circular base plate; a circular grating; a rotary motor, and a grating positioner; wherein, at least one said circular grating is mounted on the circular base plate in a peripheral direction; the output shaft of the rotary motor is coupled to the circular base plate; and the grating positioner is mounted on the circular base plate.

Another solution of the present invention is: the grating phase modulator is a rectangular grating phase modulator, and the rectangular grating phase modulator includes: a rectangular base plate; a rectangular grating; a linear motor, and a grating positioner; wherein, the at least one said rectangular gratings are mounted on the rectangular base plate in a longitudinal direction; the rotor or stator of linear motor is coupled to the rectangular base plate; and the grating positioner is mounted on the rectangular base plate.

In the above solutions, the circular gratings and rectangular gratings are blazed transmission gratings or blazed reflection gratings.

The grating phase modulator for laser interference photoetching system of the present invention has the following advantages: the grating phase modulator has the advantages of high speed of phase modulation, high precision of modulation and wide range of modulation. When the grating phase modulator of present invention is applied in the laser interference photoetching system, it enable the system to have simple structure, and enable the system to achieve image locking of high speed and high precision without influencing the quality of image, thereby improving the overall performance of the laser interference photoetching system.

In the Figures, 1—circular grating phase modulator; 11—circular base plate; 12—circular grating; 121—the first circular grating; 122—the second circular grating; 123—the third circular grating; 13—rotary motor; 4—grating positioner; 2—rectangular grating phase modulator; 21—rectangular base plate; 22—rectangular grating; 221—the first rectangular grating; 222—the second rectangular grating; 223—the third rectangular grating; 23—linear motor.

DETAILED DESCRIPTION OF THE EMBODIMENTS

The embodiments of the present invention will be described in further detail with reference to the drawings.

Figure 1:
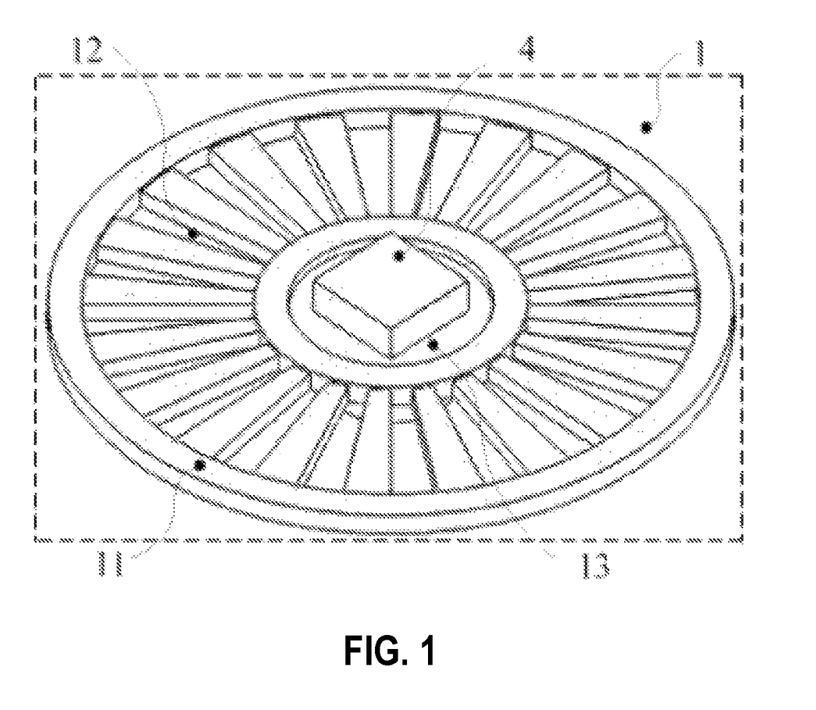
FIG. 1 illustrates the structure of a first circular grating phase modulator of the present invention.

Referring to FIG. 1, FIG. 1 illustrates the structure of a first circular grating phase modulator of the present invention. As shown in FIG. 1, the circular grating phase modulator 1 comprises a circular base plate 11, a circular grating 12, a rotary motor 13 and a grating positioner 4. The circular grating 12 is mounted on the circular base plate 11 in a peripheral direction, and only one circular grating is mounted in the first circular grating phase modulator (the pitch of the grating is enlarged in the Figure for clarity). The output shaft of the rotary motor 13 is coupled to the circular base plate 11, and the grating positioner 4 is mounted on the circular base plate 11.

Figure 2:
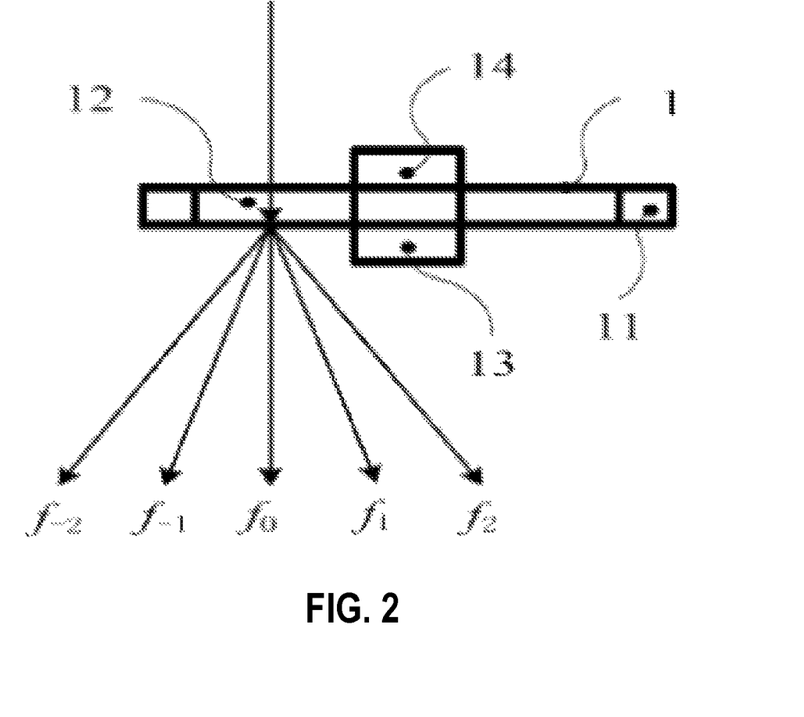
FIG. 2 illustrates the principle of a circular transmission grating phase modulator of the present invention.

Referring to FIG. 2, FIG. 2 illustrates the principle of a circular transmission grating phase modulator. As shown in FIG. 1, the circular grating 12 is a transmission grating, and diffraction is generated when a beam is incident on the circular grating 12. When the output shaft of the rotary motor 13 drives the circular grating 12 to continuously move relative to the incident light beam, the light diffracted from the grating will generates a frequency shift, and according to the formula of the Doppler frequency shift, the frequency of diffracted light of each order of $f_0$ beam is:

$$f_0, f_{\pm 1} = f_0 \pm \frac{v}{g}, f_{\pm 2} = f_0 \pm \frac{2v}{g}, \ldots$$

in which, $f_0$ is the frequency of the incident beam, $f_1$ is the frequency of the first order diffraction light, $f_2$ is the frequency of the second order diffraction light, v is the linear speed of the grating, and g is grating constant. The phase and frequency of beam has the following relation therebetween:

$$\phi = \int_0^t 2\pi f dt$$

Figure 3:
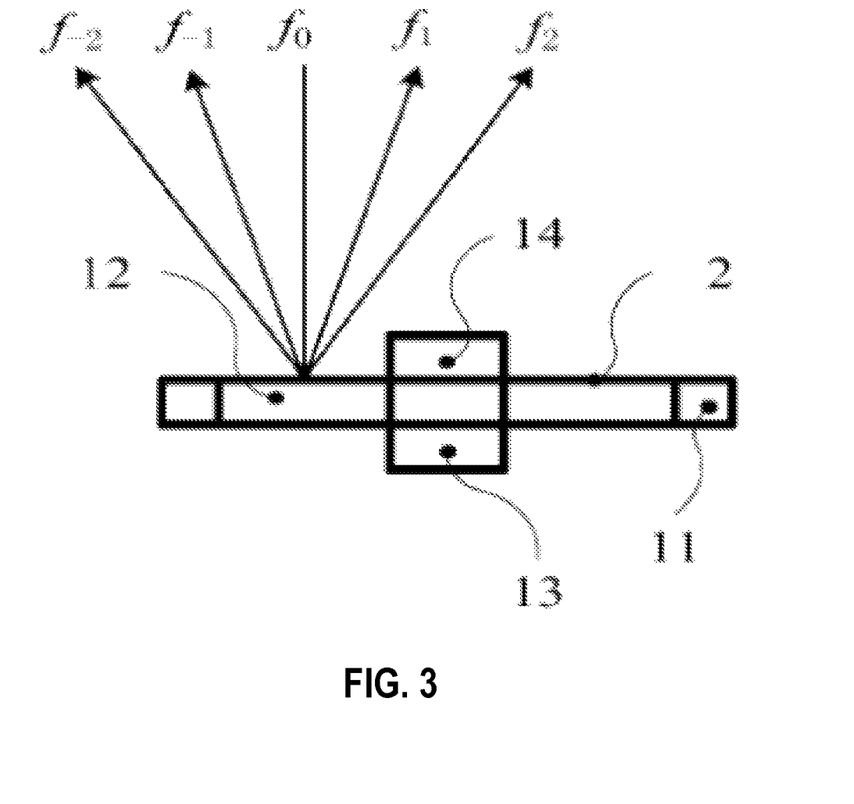
FIG. 3 illustrates the principle of a circular reflection grating phase modulator of the present invention.

The phase modulation of beam can be performed with the diffracted light except the $f_0$ order diffraction light. The grating positioner 4 is configured to detect the incident position of the beam on the circular grating 12. Referring to FIG. 3, FIG. 3 illustrates the principle of a circular reflection grating phase modulator of the present invention. As shown in FIG. 3, the circular grating 12 is a reflection grating, the modulation principle of which is similar to that of the modulator shown in FIG. 1 and the only difference therebetween lies in the direction of diffracted light. In order to get a higher efficiency of diffraction, the grating is usually a ±1 order blazed grating. Compared with an electrical optical modulator, the grating phase modulator has a high speed of modulation (driven by a high-speed motor), a high precision of modulation (high grid density of the grating) and a wide range of modulation.

Figure 4:
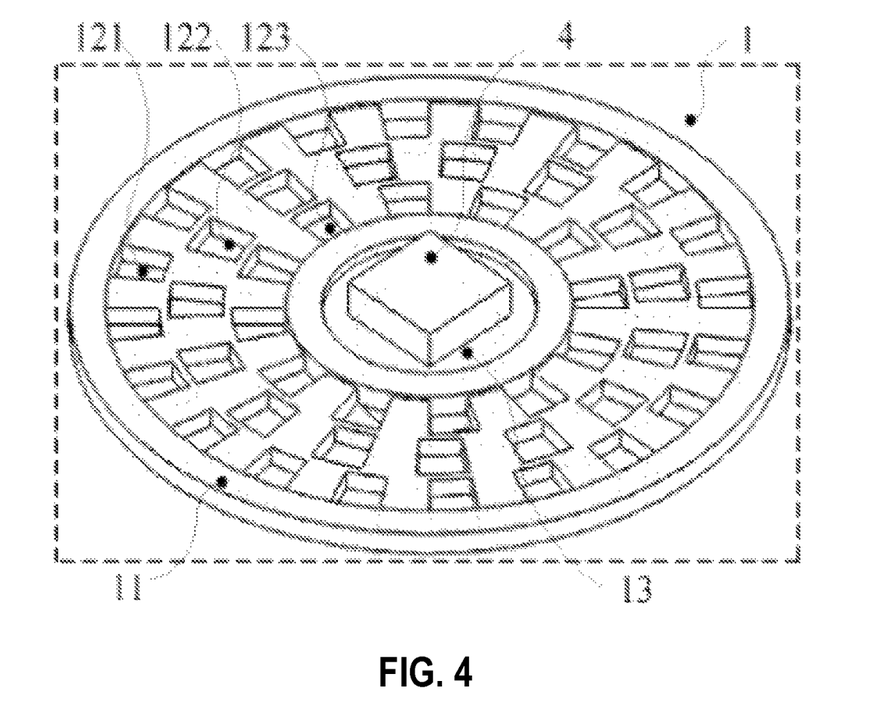
FIG. 4 illustrates the structure of a second circular grating phase modulator of the present invention.

Referring to FIG. 4, FIG. 4 illustrates the structure of a second circular grating phase modulator. As shown in FIG. 4, the circular base plate 11 of the circular grating phase modulator is mounted with three circles of circular grating, that is, a first circular grating 121, a second circular grating 122 and a third circular grating 123 (the pitches of the gratings are enlarged for clarity), and these three circular gratings have different grid densities. When an incident beam is incident on different circular gratings, the diffracted light of a same order may have different frequencies, which enables phase modulation with frequency conversion, and when the circles of grating gets more, the performance of phase modulation with frequency conversion gets better. The grating positioner 4 positions the beam to be incident on different circular gratings.

Figure 5:
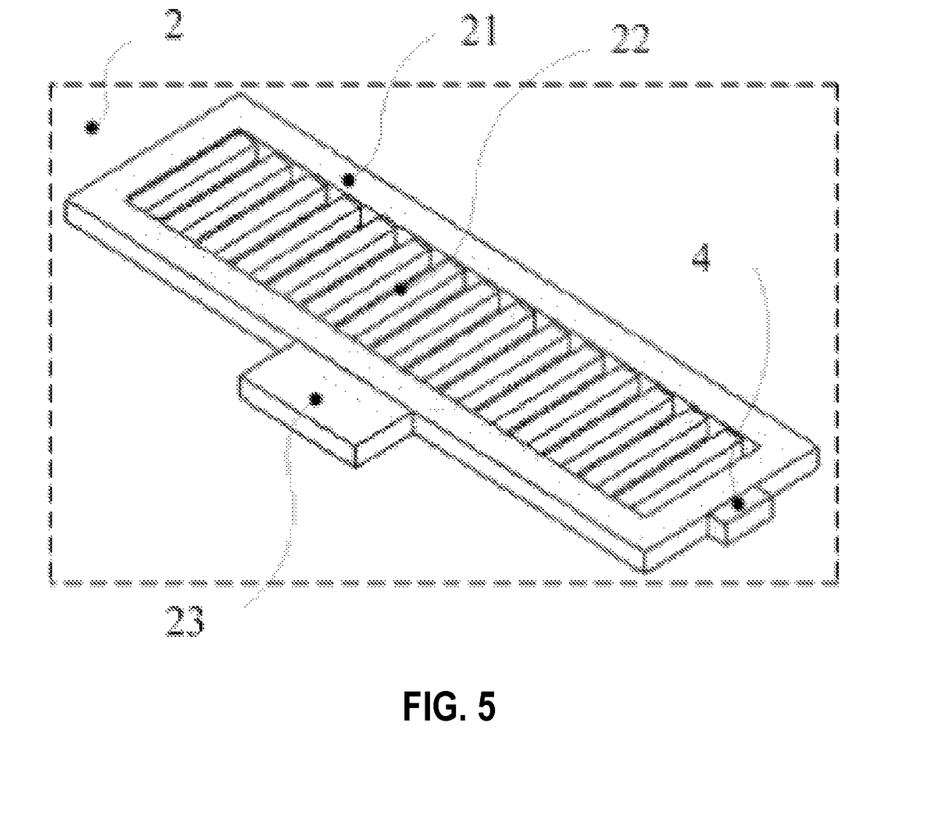
FIG. 5 illustrates the structure of a first rectangular grating phase modulator of the present invention.

Referring to FIG. 5, FIG. 5 illustrates the structure of a first rectangular grating phase modulator. As shown in FIG. 5, a rectangular grating phase modulator 2 includes a rectangular base plate 21, a rectangular grating 22, a linear motor 23 and a grating positioner 4. The rectangular grating 22 is mounted on the rectangular base plate 21 in a lengthwise direction, and only one rectangular grating is mounted in the first rectangular grating modulator (the pitch of the grating is enlarged for clarity). The rotor or stator of the linear motor 23 is coupled to the rectangular base plate 21, and the grating positioner 4 is mounted on the rectangular base plate 21. A beam is incident on the rectangular grating 22 to generate diffraction. When the rotor or stator of the linear motor 23 drives the rectangular gating 22 to continuously move relative to the incident light beam, the diffracted light from the grating will have a frequency shift thus the frequency is shifted.

Figure 6:
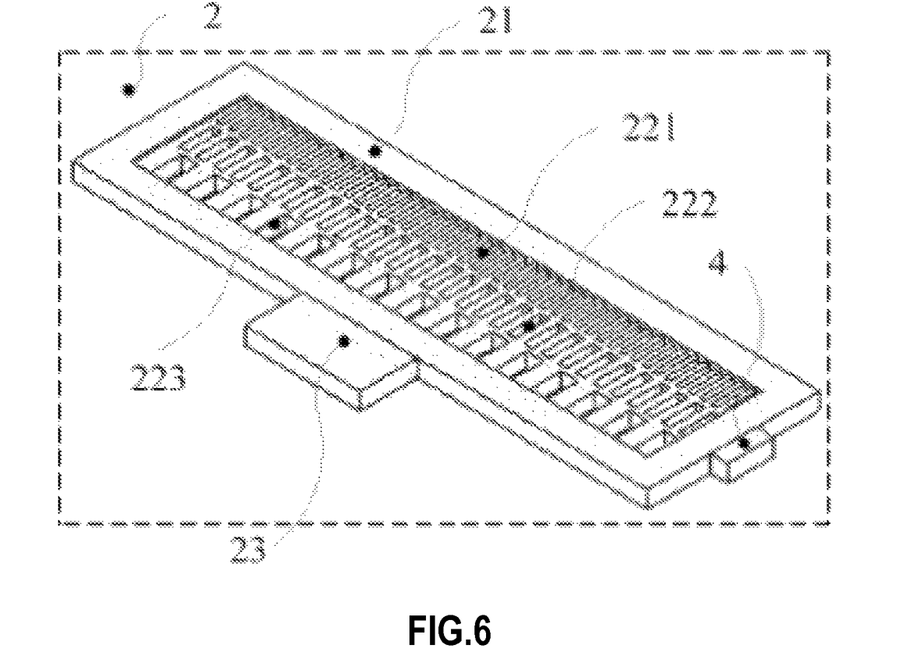
FIG. 6 illustrates the structure of a second rectangular grating phase modulator of the present invention.

Referring to FIG. 6, FIG. 6 illustrates the structure of a second rectangular grating phase modulator of the present invention. As shown in FIG. 6, the rectangular base plate 21 of the rectangular grating phase modulator is mounted with three rectangular gratings, that is, a first rectangular grating 221, a second rectangular grating 222, and a third rectangular grating 223 (the pitches of the gratings are enlarged for clarity). When an incident beam is incident on different rectangular gratings, the diffracted light of a same order may have different frequencies, which enables phase modulation with frequency conversion, and when the number of grating gets more, the performance of phase modulation with frequency conversion gets better. The grating positioner 4 positions the beam to be incident on different rectangular gratings.

What is claimed is:

1. An optical grating phase modulator for a laser interference photoetching system, wherein: the grating phase modulator is a circular grating phase modulator, and the circular grating phase modulator includes: a circular base plate; at least three circular gratings each having a different grid density; a rotary motor, and a grating positioner; wherein, the at least three circular gratings having different grid densities are mounted on the circular base plate in a peripheral direction; the output shaft of the rotary motor is coupled to the circular base plate; and the grating positioner is mounted on the circular base plate and is used to position an incident beam to be incident on the at least three circular gratings, such that when the incident beam is incident on the at least three circular gratings, diffracted light of the same order has different frequencies so as to enable phase modulation with frequency conversion.

2. A rectangular grating phase modulator for a laser interference photoetching system, wherein: the grating phase modulator is a rectangular grating phase modulator, and the rectangular grating phase modulator includes: a rectangular base plate; at least three rectangular gratings each having a different grid density; a linear motor, and a grating positioner; wherein, the at least three rectangular gratings having different grid densities are mounted on the rectangular base plate in a longitudinal direction; a rotor or stator of the linear motor is coupled to the rectangular base plate; and the grating positioner is mounted on the rectangular base plate and is used to position an incident beam to be incident on the at least three rectangular gratings, such that when the incident beam is incident on the at least three rectangular gratings, diffracted light of the same order has different frequencies so as to enable phase modulation with frequency conversion.

3. The grating phase modulator of claim 1, wherein the circular gratings are blazed transmission gratings or blazed reflection gratings.

4. The grating phase modulator of claim 2, wherein the rectangular gratings are blazed transmission gratings or blazed reflection gratings.

* * * * *